United States Patent
Kirchner et al.

(10) Patent No.: US 7,034,552 B2
(45) Date of Patent: Apr. 25, 2006

(54) OPERATOR SENSING CIRCUIT FOR DISABLING MOTOR OF POWER EQUIPMENT

(76) Inventors: Markus Kirchner, Sulzburgstr. 12, D-73265 Frickenhausen (DE); Markus Neidert, Im Goldmorgen 18, D-73265 Dettingen/Teck (DE); Ralph Sauter, Burrenweg 7, D-72636 Fruickenhausen (DE)

(*) Notice: Subject to any disclaimer, the term of this patent is extended or adjusted under 35 U.S.C. 154(b) by 17 days.

(21) Appl. No.: 10/779,829

(22) Filed: Feb. 17, 2004

(65) Prior Publication Data

US 2005/0179448 A1    Aug. 18, 2005

(51) Int. Cl.
G01R 27/26    (2006.01)
H03K 17/955   (2006.01)

(52) U.S. Cl. .................. 324/686; 324/678; 200/600

(58) Field of Classification Search ............... 324/658, 324/678, 686, 688, 76.66, 663; 200/600; 180/272, 279

See application file for complete search history.

(56) References Cited

U.S. PATENT DOCUMENTS

| | | | |
|---|---|---|---|
| 2,725,548 A * | 11/1955 | Harris | 367/181 |
| 3,703,217 A | 11/1972 | Kullick et al. | |
| 4,145,864 A | 3/1979 | Brewster, Jr. | |
| 4,814,632 A * | 3/1989 | Glaeser et al. | 307/116 |
| 5,583,386 A * | 12/1996 | Meixner et al. | 307/326 |
| 6,501,281 B1 * | 12/2002 | Rundo | 324/658 |
| 6,590,171 B1 * | 7/2003 | Wolf et al. | 200/51 LM |
| 6,894,507 B1 * | 5/2005 | Morimoto | 324/661 |
| 2003/0202851 A1 * | 10/2003 | Kovarik | 408/8 |

FOREIGN PATENT DOCUMENTS

DE  43 44 187   12/1993
EP  0701917    9/1995

* cited by examiner

Primary Examiner—Anjan Deb
(74) Attorney, Agent, or Firm—Neil F. Markva

(57) ABSTRACT

A calibrated operator-sensing circuit having a microcontroller that commands a charge-transfer sensor to send a sensor charge signal to a capacitive sensing electrode. The sensor receives a discharge signal from the electrode and outputs a corresponding raw data signal to the microcontroller that in turn sends a signal that disables the motor of a unit of power equipment upon the absence of an operator's hand on a hand-gripping surface of the equipment. The capacitive operator-hand sensing electrode operates within a predetermined output capacitor discharge range that includes preselected binary digit values that designate hands-off and hands-on conditions on the hand-gripping surface. The capacitor discharge range is effective to distinguish between the presence of an operator's hand and foreign material on the gripping surface for avoiding a false hands-on signal. The operator-hand sensing electrode includes an inner dielectric material layer contiguously disposed on a metal handle portion of the power equipment, a metal sheet foil conductor material layer contiguously disposed on the dielectric material, and an outer dielectric hand-grip material having a hand-gripping surface.

17 Claims, 4 Drawing Sheets

OPERATOR SENSING CIRCUIT FOR DISABLING MOTOR OF POWER EQUIPMENT

BACKGROUND OF THE INVENTION

1. Field of the Invention

This invention relates generally to a capacitive, operator-sensing circuit for disabling a component such as the motor of power equipment. More particularly, the invention relates to a capacitive, operator-sensing circuit having a charge transfer sensor coupled to a capacitive sensing electrode affixed to a gripping surface that allows power equipment operation when manually grasped but disables its motor upon sensing removal of an operator's hand from the gripping surface.

2. Description of the Prior Art

Manually-operated power lawn and garden maintenance equipment, construction equipment, and agricultural implements such as chainsaws, lawnmowers, snow-blowers, lawn edgers, garden tractors, cultivators, and the like are in widespread use. Such equipment includes dual hand-grips, a steering wheel, or a handle bar having a gripping surface that the operator grasps to operate and control it. Known mechanical and electrical dead-man switches sense the absence of the operator's hand on the gripping surface and send a signal to disconnect the motor of the power equipment. While such mechanical switches are known commercially, no electrical dead-man switch system is currently commercially viable.

U.S. Pat. No. 3,703,217 discloses an electrical system comprising a steering wheel including a capacitive sensing electrode that produces a first value of charge in the presence of the operator's hand, and a second value in its absence. A bridge circuit acts as a charge transfer processing sensor that provides an electrical charge to the sensing electrode and generates a first output signal when sensing the first value of electrode charge in the presence of the operator's hand and a second output signal when sensing the second value of electrode charge. The respective first and second sensor output signals are electrically coupled to allow the motor of the vehicle to continue operating, or to shut the vehicle down when they differ.

U.S. Pat. No. 6,501,281 discloses a self-calibrating charge-transfer processing sensor that periodically sends an electrical charge to a capacitive sensing electrode that produces a first value of charge in the presence of the operator's hand, and a second value in its absence. The charge-transfer sensor then senses and processes the first and second electrode charge values to produce respective output signals to allow the vehicle motor to continue operating, or to shut the vehicle down by switching off the power unit on sensing a second value different from the first value.

Without a man touching the gripping surface ("hands-off" status), this type of system has an overall electrical capacitance. Upon touching the gripping surface ("hands-on" status), the system capacitance increases. Upon starting the power equipment engine, the known QT sensor calibrates itself and sets the measured capacity as a "hands-off" status at the sensing electrode affixed to the gripping surface. It is possible that starting the equipment motor requires a first person to start the motor while another holds the gripping surface. Then when the engine is started with the operator's hands actually on the gripping surface, the disclosed self-calibrating sensor defines that "hands-on" condition as a "hands-off" status. A physical change from a "hands-on" gripping surface status to a "hands-off" status reduces the overall capacitance of the system. So if the sensor calibrates itself with a faulty "hands-on" status as described, the "hands-off" status will not be detected until the next calibrating process that occurs after the next change of system capacitance. For the prior art sensor registers only one-way changes of capacitance in the disclosed system.

Described in terms of bit information values—digits, the charge transfer sensor periodically sends bits of information to the operator-sensing electrode and receives digit values from the electrode that the sensor internally processes. The sensor sets a standard "hands-off" first value number of digits each time the power equipment is started. Subsequently each time the sensor transfers an information charge to the electrode, the sensor receives and internally processes a return digit value to produce a sensor-processed output signal that will stop the power equipment engine if the second digit value is different from the first digit value. The startup self-calibration of an internally processing sensor is faulty and leads to another problem. Often water and dirt are found on the gripping surface and/or the operator may use gloves that increase the overall capacitance of the sensing circuit. Because the sensor is self-calibrating and self-processing, the presence of water and dirt or mud may change the first and second value of the return signal to the sensor so that the system does not distinguish between a "hands-on" and a "hands-off" condition. Therefore it may issue output signals to stop the motor while an operator's hand is still grasping the gripping surface.

Another problem discovered with the '281 patent sensing electrode is its physical electrode form of a wire coil or metal net wrapped around the handle within the gripping surface. Longer lateral edges of the wire in the coil or net increases the capacitance of the prior art system, and it has been unexpectedly discovered that the known physical electrode structure is more sensitive to the presence of water, dirt, and/or muddy mixture. So the circuit may not consistently distinguish between a "hands-on" gripping-surface status and the presence of the water, dirt, and/or muddy mixture. The problem is greater if the operator is wearing gloves.

PURPOSE OF THE INVENTION

An object of the invention is to provide an operator-sensing circuit that has no false "hands-on" status digit sensing values; that ensures the circuit's ability to distinguish between an operator's hand and foreign material on the gripping surface; and that provides a continuous check on the overall capacity with a capacitive reference simulator electrode to monitor for defects the system, and a fail-safe microcontroller.

Another object of the invention is to provide an operator-sensing circuit having set built-in calibration to establish a safe-operating band of digit sensing values with a pre-selected maximum "hands-off" digit value and a lower "hands-on" digit value that are not adversely affected by foreign materials located on the gripping surface.

A further object of the invention is to provide an operator-sensing circuit having a sensor that does not internally process the electrode digit signals but simply counts the digit value to send a raw data output signal to a microcontroller, which processes and evaluates the signal to determine whether or not to disable the power equipment motor.

Still another object of the invention is to provide an operator-sensing circuit having a fail-safe microcontroller to ensure valid processing of the raw data output signal produced by the sensor.

A still further object of the invention is to provide an operator-sensing circuit having a system capacitive check using a simulated reference sensing electrode to confirm valid operational conditions and to detect system defects such as short circuits, breaks in transmitting wires, and malfunctioning electrical system units.

Another object of the invention is to provide an electrical dead-man switch circuit that includes a capacitive operator-sensing electrode comprising an elongated metal foil tube having a length that is shorter than the width of an operator's hand and having end surfaces each disposed in a respective plane that is perpendicular to the longitudinal axis of the tube at opposed ends of the foil tube.

SUMMARY OF THE INVENTION

The invention is an electrical characteristic in an operator-sensing circuit having a charge-transfer sensor that sends a sensor charge signal to a capacitive sensing electrode and receives a discharge signal from the electrode for disabling the motor of a unit of power equipment upon the absence of an operator's hand on a hand-gripping surface of the equipment. The electrical characteristic comprises capacitive means for setting a predetermined operating output capacitor discharge range includes preselected binary digit values that designate hands-off and hands-on conditions on the hand-gripping surface. The capacitor discharge range is effective to distinguish between the presence of an operator's hand and foreign material on the gripping surface for avoiding a false hands-on signal. The capacitive means includes operator-hand sensing electrode means having an inner dielectric material layer contiguously disposed on a metal handle portion of the power equipment, a metal conductor material layer contiguously disposed on the dielectric material, and an outer dielectric hand-grip material having a hand-gripping surface. So when the operator's hand grasps the outer hand-grip material disposed around the metal conductor material layer the capacitance is increased and the sensing electrode means produces a smaller discharge signal to indicate a hands-on condition on the hand-gripping surface. The capacitor discharge range includes a hands-off section in which foreign materials such as water, dirt, and mud add capacitance to the hand-gripping surface that may produce a false hands-on condition, and a true hands-on section in which the operator's hand is grasping the hand-gripping surface and provides an accurate capacitor discharge digit value that allows the power equipment continued operation.

In a specific embodiment the metal conductor layer includes a metal foil wrapped around the inner dielectric material. The inner dielectric material layer has the structural configuration of a tube that extends along the length of the metal handle portion. The metal foil has the structural configuration of a tube having a longitudinal axis and that extends along a delimited length of the inner dielectric material tube. The metal foil tube has opposed end edges that are each disposed in respective planes that traverse the longitudinal axis of the metal foil tube, and the outer hand-grip material has a length sufficient to overlap the opposed end edges of the metal foil tube. The metal handle portion is composed of steel having a layer thickness of about 2 mm, or of aluminum tubing up to 4 mm in thickness, and an outer diameter of about 20 to 30 mm. The inner dielectric material is plastic material about 1.5 mm to about 2 mm in thickness and selected from the group consisting of polypropylene and polyethylene. The metal conductor material comprises copper and the foil layer has a thickness of about 0.10 mm to about 0.15 mm. The metal foil tube has a length of from about 50 mm to about 60 mm, the opposed end edges are disposed about 30 mm from the ends of the hand-grip material, and the opposed respective transverse planes are perpendicular to the longitudinal axis of the foil tube.

Another feature of the invention is directed to a combination of multiplexing means and microcontroller means in an operator-sensing circuit having a charge-transfer sensor that sends a sensor charge signal to a capacitive sensing electrode and in response receives a discharge signal from the electrode for disabling the motor of a unit of power equipment upon the absence of an operator's hand on a hand-gripping surface of the equipment the combination comprises capacitive means including operator-hand sensing electrode means and reference simulator electrode means for receiving the sensor charge signal from the multiplexing means. The simulator electrode means is effective to send a reference discharge signal having a designated standard digit value for determining a defect in the operator-sensing system. The microcontroller means is electrically coupled to the multiplexing means that includes a series of switches for issuing electrode switching signals to alternately turn the series of switches on and off to sequentially send the sensor charge signal to each sensing electrode means and reference simulator electrode means, and in response to sequentially receive from each sensing and reference electrode means respective electrode discharge digit signals. The microcontroller means is electrically coupled for issuing command signals to the charge-transfer sensor to send the charge signal to the multiplexing means for distribution to the sensing and reference electrode means. The charge-transfer sensor is effective to send a raw data output discharge signal corresponding to each respective electrode discharge digit signal to the microcontroller means for processing. And the microcontroller means is effective to disable the engine upon determining that the reference discharge signal does not conform to the designated standard digit value, and upon alternatively determining that the electrode sensing discharge signal indicates the absence of the operator's hand from the hand-gripping surface.

Another feature of the inventive circuit comprises capacitive means and the microcontroller means is programmable for setting a predetermined operating output capacitor discharge range including preselected binary digit values that designate hands-off and hands-on conditions on the hand-gripping surface. The capacitor discharge range is effective to distinguish between the presence of an operator's hand and foreign material on the gripping surface for avoiding a false hands-on signal. In a specific embodiment, a preselected binary digit value of about 700 digits designates a hands-on condition for the sensing electrode means affixed to a hand-gripping surface, and a preselected binary digit value of about 900 digits designates a hands-off condition for the sensing electrode means affixed to a hand-gripping surface. The capacitor discharge digit value of said reference simulator electrode means is about 400 digits. The capacitor discharge range includes a hands-off section in which foreign materials add capacitance to the hand-gripping surface that might produce a false hands-on condition, and a true hands-on section in which the operator's hand is grasping the hand-gripping surface to provide an accurate capacitor discharge digit value that allows the power equipment continued operation. The capacitor discharge digit value range of the true hands-on section is about 700 to about 750 digits, and the capacitor discharge digit value range of the false hands-on section is about 750 to about 900 digits.

A further inventive feature of the microcontroller means comprises a first microprocessor means electrically coupled to the charge-transfer sensor and second microprocessor means electrically coupled to the first microprocessor means. The first microprocessor means is electrically coupled to the multiplexing means for sequentially turning sensing electrode and reference simulator electrode switches on and off to send said charge signals through to the respective sensing and reference electrode means. The first microprocessor means is effective for commanding the sensor to send charge signals to the multiplexing switches to be sent through to the sensing and reference electrode means that in response send capacitive discharge signals to the sensor means which produces respective raw data output signals corresponding to the capacitive discharge signals received. The second microprocessor means is effective to receive the raw data output signals to conduct a control check on the first microprocessor means and to double check the raw data output signals. The first and second microprocessor means are electrically coupled to respective relay switches that are, in turn, electrically coupled to the ignition system of the motor. Each of the first and second microprocessor means independently processes the raw data output signals to produce an output microprocessor signal to its respective relay switch that is effective to shut the ignition down when said microprocessor output signals to their respective relay switches are not the same.

A further feature of the invention is a method of sensing the presence of an operator's hand on a gripping surface of a power equipment unit and causing cessation of operation of a component system of the equipment if the operator's hand is removed from the gripping surface. The method comprises providing a sensing electrode affixed to said gripping surface that includes a capacitive means for operating within a predetermined output capacitor discharge range including preselected binary digit values that designate hands-off and hands-on conditions on the hand-gripping surface. The capacitor discharge range is effective to distinguish between the presence of an operator's hand and foreign material on the gripping surface for avoiding a false hands-on signal.

The capacitor discharge range includes a hands-off section in which foreign materials add capacitance to the hand-gripping surface that may produce a false hands-on condition, and a true hands-on section in which the operator's hand is grasping the hand-gripping surface and provides an accurate capacitor discharge digit value that allows the power equipment continued operation. Providing a charge-transfer sensor electrically coupled to the sensing electrode, and providing microcontroller means electrically coupled to the charge-transfer sensor for periodically commanding the sensor to transfer charge to the sensing electrode that senses the quantity of charge on the sensing electrode and generates a raw data output signal to the microcontroller means when the quantity of charge on the sensing electrode is sensed. Processing the raw data output signal in the microcontroller means to determine if the quantity of charge on the sensing electrode is in true hands-on section of the capacitor range. The microcontroller means is electrically coupled to the component system of the equipment and causes cessation of operation of the component system when the raw data output signal of the charge-transfer sensor indicates that the quantity of charge is not within the true hands-on section of said capacitor discharge range. In one specific embodiment, the component system is an internal combustion engine of the equipment and electrically couples the ignition system of the engine to ground to shut off the engine when the raw data output signal indicates that the quantity of charge is not within the true hands-on section of said capacitor discharge range. In another embodiment, the component system is an electric motor of the equipment and electrically interrupts a supply of power to the electric motor to shut off the electric motor when the raw data output signal indicates that the quantity of charge is not within the true hands-on section of said capacitor discharge range.

An inventive specific embodiment of a combination of a capacitive operator-sensing circuit with a mobile power equipment unit comprises an internal combustion engine, a magneto of the engine's ignition system, and a hand-gripping surface for an operator to grip and control movement of the mobile power equipment unit. The capacitive operator-sensing circuit is adapted to sense the presence of an operator's hand on the gripping surface to shut off the engine if the operator's hand is absent from the gripping surface. The capacitive operator-sensing circuit includes sensing electrode means affixed to the gripping surface that includes capacitive means for operating within a predetermined output capacitor discharge range that includes preselected binary standard digit values that designate hands-off and hands-on conditions on the hand-gripping surface. The capacitor discharge range includes a hands-off section in which foreign materials add capacitance to the hand-gripping surface that may produce a false hands-on condition, and a true hands-on section which indicates that the operator's hand is grasping the hand-gripping surface.

The sensing electrode means is electrically coupled to charge-transfer sensor means for sensing any quantity of charge on the electrode means, and the charge-transfer sensor means is electrically coupled to the microcontroller means for periodically commanding the sensor means to transfer charge to the sensing electrode means, and to sense the quantity of charge on the sensing electrode means. The sensor means is effective to generate raw data output signals for the microcontroller means to process when the quantity of charge on the sensing electrode is sensed. The microcontroller means is effective to process a raw data output signal for determining if a corresponding quantity of charge on the sensing electrode is in the true hands-on section of the capacitor range. The microcontroller means is electrically coupled to the magneto of the ignition system for causing cessation of the engine when the raw data output signal of the charge-transfer sensor means indicates that the sensed quantity of charge is not within the true hands-on section of said capacitor discharge range.

BRIEF DESCRIPTION OF DRAWINGS

Other objects of this invention will appear in the following description and appended claims, reference being made to the accompanying drawings forming a part of the specification wherein like reference characters designate corresponding parts to the several views.

DETAILED DESCRIPTION OF SPECIFIC EMBODIMENTS

Figure 1:
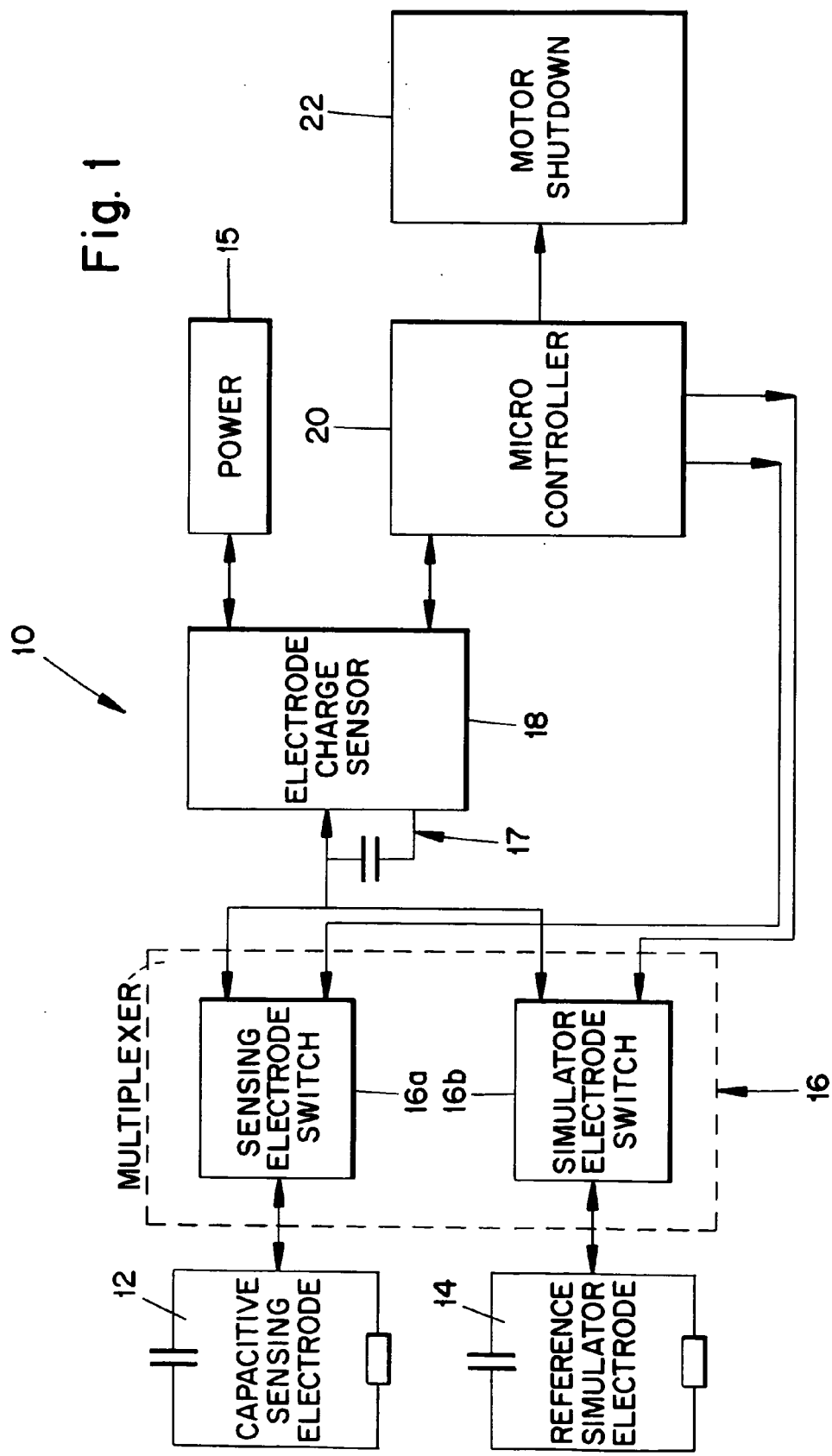
FIG. 1 is a schematic diagram of the operator-sensing circuit of the invention.

Referring to FIG. 1, an operator-sensing circuit, generally designated 10, includes a capacitive sensing electrode 12 affixed to the gripping surface of the power equipment and reference simulator electrode 14 respectively connected electrically to sensing electrode switch 16a and simulator electrode 16b of multiplexer 16. Charge sensor 18 may be any programmable charge-transfer sensor that does not process the capacitance electrode discharge signals and is not self-calibrating. In a specific embodiment, sensor 18 has a commercial designation of QT 300 and receives electrical power from a 3–5 volt battery 15. Sensor 18 sends information signals to multiplexer 16 upon command from microcontroller 20 every 5 milliseconds that also sends a series of commands to multiplexer 16 to turn electrode switches 16a and 16b on and off to send the information signals to electrodes 12 and 14 and in response receives an electrode discharge signal through the closed (on) switch in multiplexer 16. Sensor 18 performs a measuring function in comparing the number of digits received from electrodes 12 and 14 with respect to capacitor 17. Sensor 18 then provides a raw data output signal to microcontroller 20 that knows to which electrode 12 or 14 the signal relates based on which switch microcontroller 20 has closed. For microcontroller 20 sends a cycle of sequential switching signals to multiplexer 16 to sequentially turn sensing electrode switches 16a and reference simulator electrode switch 16b off and on to allow the information signals to flow to and from electrodes 12 and 14. The information flow indicates a hands-on or hands-off status with respect to each operator hand-sensing and reference electrode in accord with the graphic diagram of FIG. 7 discussed below. While FIG. 1 shows only one sensing electrode 12, the process and circuit for performing the operator-sensing method of the invention may include two hand-grips as shown used in the power equipment 30 and 55 of FIGS. 3 and 4.

Figure 3:
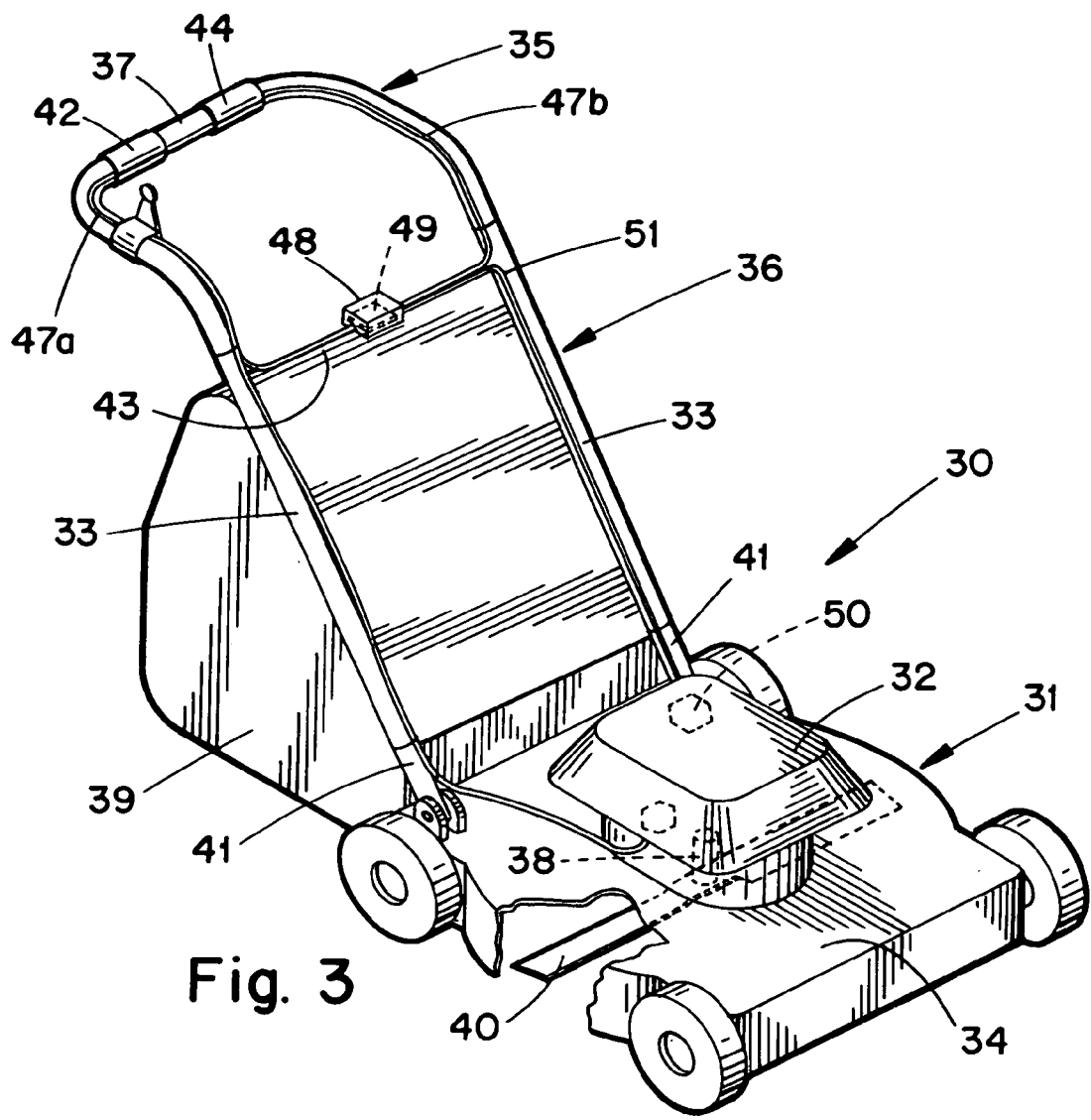
FIG. 3 is a perspective view of a lawnmower having an operating-sensing circuit of the invention.
Figure 4:
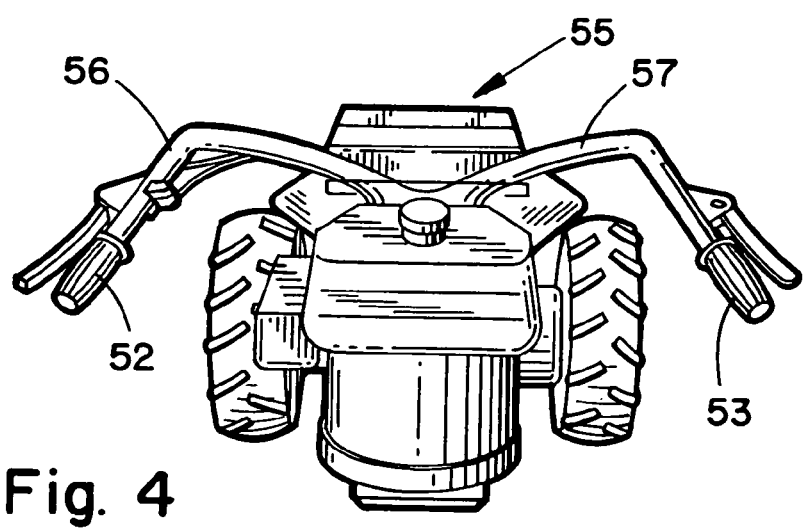
FIG. 4 is a perspective view of a motor vehicle having an operator-sensing circuit of the invention with dual hand-grip electrodes.

On receiving the information charge of sensor 18, electrodes 12 and 14 sequentially return binary information measured in digits to sensor 18 and capacitor 17. Operator-sensing circuit 10 is calibrated so that reference simulator electrode 14 always sends a preselected standard of 400 digits to charge sensor 18 so long as simulator electrode 14 senses no defect in multiplexer 16 or short circuit in the system. If sensor 18 does not receive 400 digits from reference electrode 14, microcontroller 20 receives an output signal of raw data from sensor 18 to evaluate and process the reference return signal and then it sends a shut-down signal to motor shut-down circuit 22. In this embodiment, the capacitance of reference electrode 14 is 100 pF (100× $10^{-12}$ farads) and the capacitance of sensor capacitor 17 is 150 nF (150×$10^{-9}$ farads). As noted, operator-sensing unit circuit 10 of FIG. 1 is used with a one hand-gripping surface as found on a chainsaw, for example. In power equipment having to hand-grips as shown in FIGS. 3 and 4, a capacitive sensing electrode 12 is affixed to the gripping surface of each hand-grip.

Figure 5:
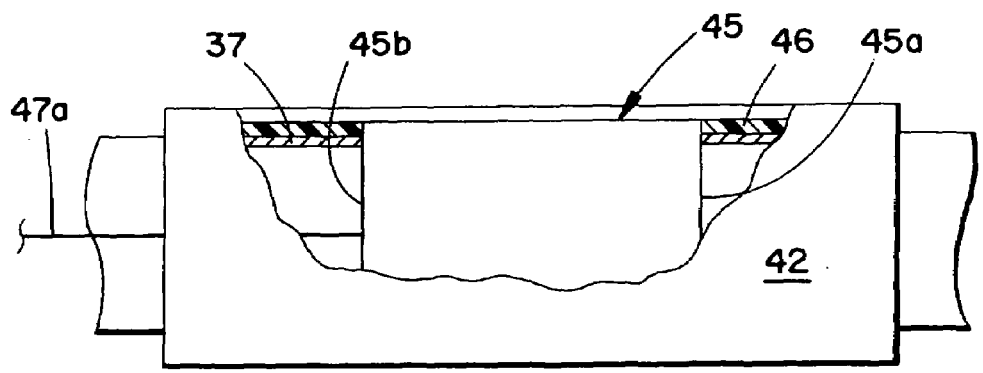
FIG. 5 is a fragmentary, elevational view, partially in section, of a hand-grip as shown on the lawnmower of FIG. 3.

Lawnmower, generally designated 30, includes a steel or aluminum housing 31 having a flat upper deck 34 that supports an internal combustion engine 32. In operation, engine 32 rotatably drives a vertical drive shaft 38 and a grass cutting blade 40 that is positioned below deck 34 and enclosed by housing 31. Handle 36 has an upper portion, generally designated 35, and two parallel angled portions 33 including respective end portions 41. The operator's hands are typically spaced apart at gripping surfaces 42 and 44 along handle-gripping portion 37. Handle 36 is comprised of steel or aluminum with hand-grips 42 and 44 typically composed of soft plastic, rubber, or neoprene. The outer surface of grips 42 and 44 define gripping surfaces that the operator grasps when operating lawnmower 30. Referring to FIG. 5, hand-grip 42 comprises an outer gripping layer disposed over metal foil tube 45 having opposed end surface edges 45a and 45b located in respective planes that are perpendicular to the longitudinal axis of tube 45. Metal foil tube 45 is disposed on a plastic tube 46 that is mounted to metal handle portion 37. Outer cover 42 overlaps end edge surfaces 40a and 40b by about 30 millimeters with the length of metal coil tube 45 being about 50 millimeters. Shielded wires 47a and 47b direct signals to and from electrodes 42 and 44 and circuit board 49 bearing the system circuitry 10 located in housing 48 mounted on cross-member 43. Shielded wire 51 directs signals from microcontroller 20 to the ignition magneto 50 of motor 32.

Sensor 18 provides one signal to multiplexer 16 so that when microcontroller 20 commands sensor 18 and multiplexer 16 with switches 16a and 16b to turn on and off in sequence, that same impulse burst from sensor 18 will be sent to the respective sensing and simulator electrodes 12 and 14. Sensor 18 does not differentiate the location of the digit signal coming from the sensing electrode 12 and the reference simulator electrode 14. Sensor 18 simply counts the number of digits that come from multiplexer 16 and compares it to the capacity value of capacitor 17 when sensor 18 sends an impulse burst signal of charge to the sensing and reference simulator electrodes. When an operator's hand is on the gripping surface, the capacitance becomes larger and the number of digits sent from an electrode to sensor 18 is accordingly smaller.

Figure 7:
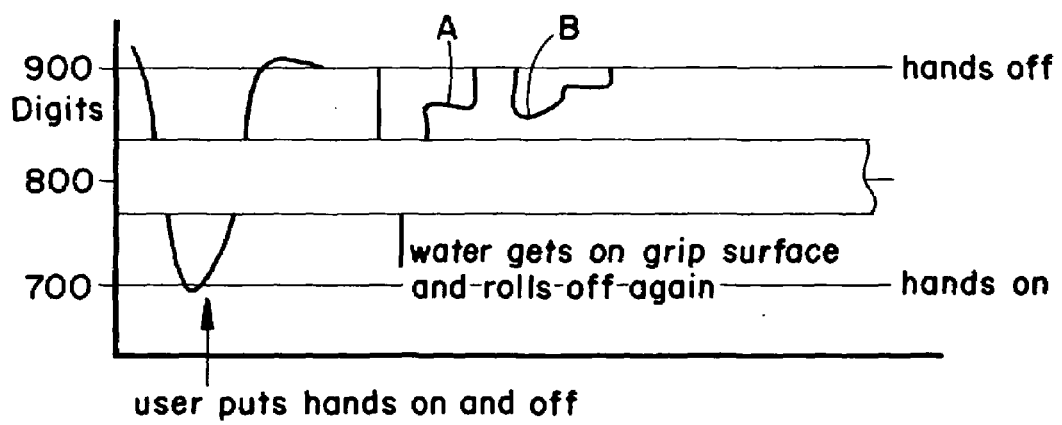
FIG. 7 is a graphic diagram showing a hands-on/hands-off calibrated detection zone of an operator-sensing circuit of the invention.

As shown in FIG. 7, the calibrated operator sensing circuit 10 shows capacitive means for operating within a predetermined output capacitor discharge range that includes preselected binary digit values that designate hands-off and hands-on conditions on the hand-gripping surface. The capacitor discharge range is effective to distinguish between the presence of an operator's hand and foreign material on the gripping surface for avoiding a false hands-on signal, and shows that the capacitance of the system reads in two different directions. The gripping surface capacitance of operating curve A shows that the longer the edge length of the metal electrode coil as found in U.S. Pat. No. 6,501,281, the more the capacitance of the electrode changes with the presence of water on the gripping surface. Curve B shows the capacitance curve with a metal foil with end edges having a length less than the wire coil as shown in curve A.

Figure 6:
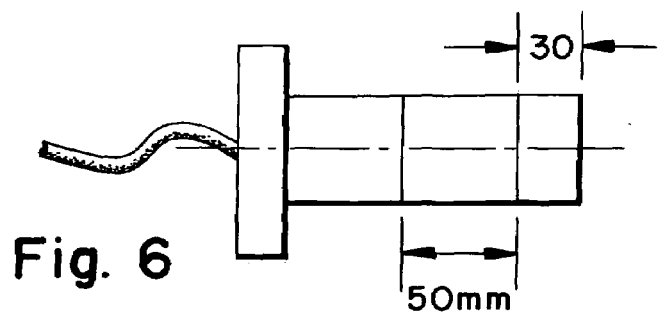
FIG. 6 is a diagrammatic elevational view of an operator-sensing electrode affixed to a gripping surface (not shown) of a hand-grip of the vehicle of FIG. 4.

As shown, with a hands-on condition sensing electrode 12 will discharge about 700 to about 760 digits to sensor 18. With a hands-off condition on the gripping surface, about 850 to about 900 digits are sent to sensor 18. The gray band is a safe hands-off detection zone in which sensor 18 will send a raw data output signal to microcontroller 20 to disable the component system of the power equipment 30 and 55. Thus system 10 eliminates the possibility that a false hands-on condition will be reported to microcontroller 20 because water and dirt produces a capacitance discharge signal that is always in the hands-off section of the output discharge range as shown in FIG. 7. Hand-grips 42, 44 on handle portion 37, and hand-grips 52, 53 on handle portions 56, 57 are associated with a metal foil tube, as shown, having an edge surface in a plane that is perpendicular to the longitudinal axis of the grip as shown in FIGS. 5 and 6. It has been unexpectedly found that the foil tube of the invention must be shorter than the width of a operator's hand (about 50 millimeters), and that the outer grips 42, 44 and 52 ,53 should overlap the end edges by about 30 millimeters as in FIGS. 5 and 6.

If for example, the diameter of the grip is about 20 to about 30 millimeters, the circumference at one edge is about 60 to 90 millimeters so with two edges at opposed ends of the tube the approximate edge length is about 120 to 180 millimeters. Thus the metal foil tube is less likely to be affected by water and dirt on the gripping surface. On the other hand, with about 2,000 millimeters length of edge such as may be available in a wire coil or net-shaped metal coil used on the electrode, the electrode capacitance is more likely to be more greatly increased to approach a false hands-on signal when water and dirt or a mixture thereof is on the hand-gripping surface. A glove on the hand would not produce as much capacitance as the bare hand, but would still fall within the hands-on segment below the gray band. If sensor 18 received from about 700 to about 750 digits then microcontroller 20 knows that a hands-on condition exists on the gripping surface. The most difficult condition on the gripping surface is when the operator is wearing thick gloves and water and mud are present. The dark band is a safe band where neither constitutes a safe range of capacitance. So any digits above the lower limit of the band would stop the power equipment motor. So any digits above the lower limit of the band would stop the power equipment motor.

Figure 2:
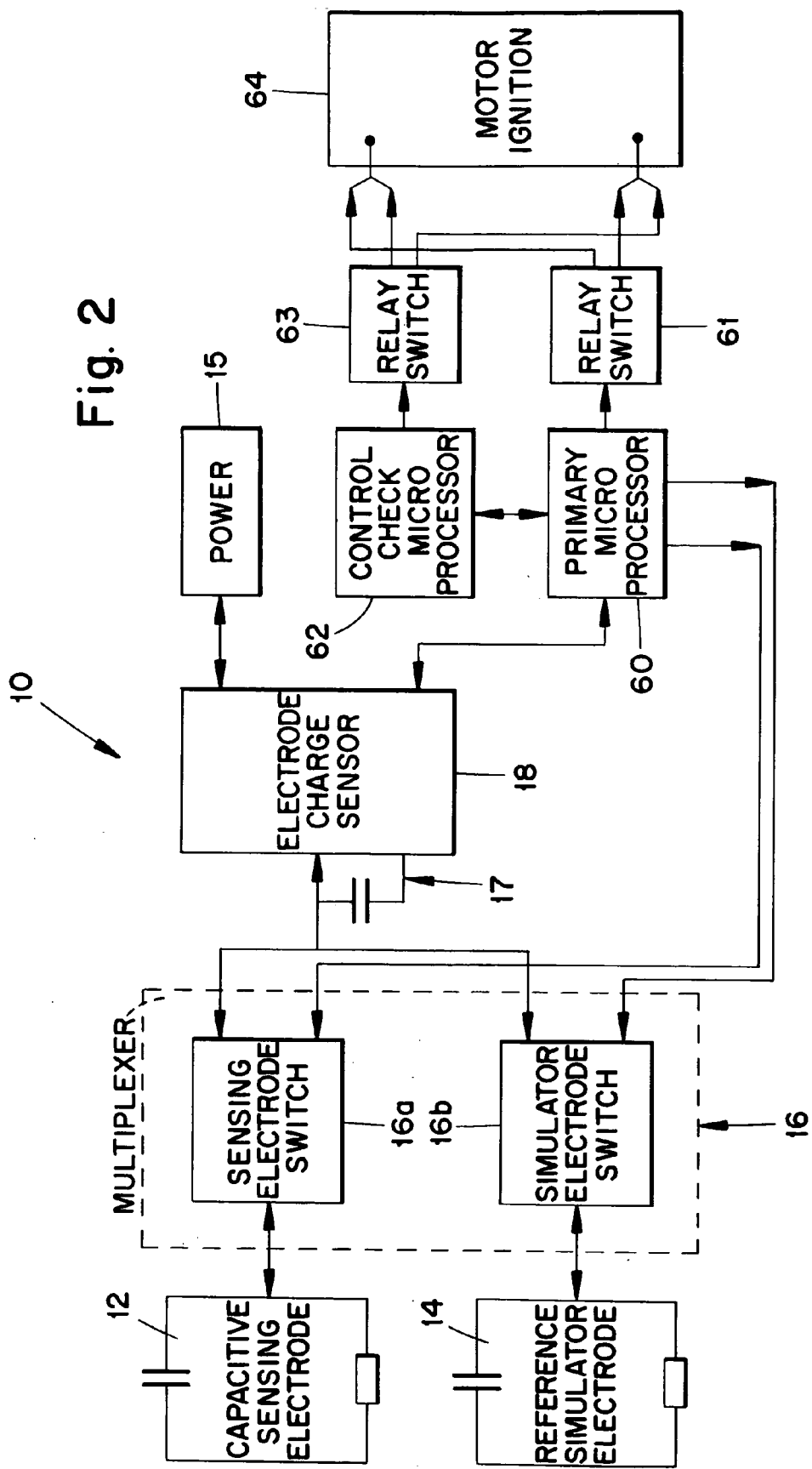
FIG. 2 is a schematic diagram of another embodiment of a microcontroller that may be used in the operator-sensing circuit of FIG. 1.

FIG. 2 shows another embodiment of system circuit 10 having a fail-safe microcontroller. Microprocessor 60 electrically coupled to sensor 18 and microprocessor 62 electrically coupled to microprocessor 60. Microprocessor 60 is electrically coupled to multiplexer 16 for sequentially turning sensing electrode switch 16a and reference simulator electrode switch 16b on and off to send charge signals through to the respective sensing electrode 12 and reference electrode 14. Assuming that the push-lawnmower 30 of FIG. 3 is started without an operator's hand on one of the hand-grips 42 and 44. Microprocessor 60 does not start commanding sensor 18 to send charge signals to multiplexing switches 16a and 16b until a hand-grip 42 and 44 is grasped. Vehicle 55 has a clutch and can be started with or without hands-on either hand-grip 52 or 53 in the pre-calibrated system of the invention. In this instance, microcontroller 60 starts its commands to sensor 18 that sends a charge signal to sensing electrode 12 and reference electrode 14 upon releasing the clutch. In immediate response electrodes 12 and 14 send capacitive discharge signals to sensor 18 which produces respective raw data output signals corresponding to the capacitive discharge signals received.

Microprocessor 60 receives the sensor output signals and sends them to microprocessor 62 to conduct a control check on microprocessor 60 and to double check the raw data output signals. Both microprocessors 60 and 62 receive the same raw data output signals and independently process the raw data output signals to produce an output microprocessor signal to its respective relay switch. Both output microprocessor signals must be the same for relay switches 61 and 62 to respond in an identical manner and maintain power to motor ignition 64. Otherwise relay switches shut the ignition down when either one of the microprocessor output signals is not the same as the other.

While the operator sensing circuit for disabling a motor of power equipment has been shown and described in detail, it is obvious that this invention is not to be considered as limited to the exact form disclosed, and that changes in detail and construction may be made therein within the scope of the invention without departing from the spirit thereof.

We claim:

1. An operator-sensing circuit in a calibrated operator sensing system, said circuit comprising:
  a) microcontroller means electrically connected for sending commands to a charge-transfer sensor electrically connected for sending sensor charge signals to capacitive means, and receiving raw output capacitive electrode discharge data signals from said capacitive means;
  b) upon command by said microcontroller means, said charge-transfer sensor sends a sensor charge signal to said capacitive means having a capacitive hand-sensing electrode disposed on a hand-gripping surface of a unit of power equipment and receives a discharge output signal from the hand-sensing electrode and sends a raw discharge output signal to said microcontroller means electrically connected for disabling the motor of a unit of power equipment upon the absence of an operator's hand on a hand-gripping surface of the equipment;
  c) said capacitive means having an electrical characteristic for operating within a predetermined output capacitor discharge range that includes preselected binary digit values that designate hands-off and hands-on conditions on the hand-gripping surface;
  d) said capacitor discharge range is effective to distinguish between the presence of an operator's hand and foreign material on the gripping surface for avoiding a false hands-on signal.

2. The operator-sensing circuit as defined in claim 1, wherein
  said predetermined output capacitor discharge range includes a true hands-on section in which the operator's hand is grasping the hand-gripping surface and provides an accurate capacitor discharge digit value that allows the power equipment continued operation;
  said circuit includes microcontroller means electrically connected to a motor shut-down circuit, a reference simulator electrode for sending reference discharge signals having a designated standard digit value to said charge-transfer sensor, and multiplexing means having a hand-sensing electrode switch and a simulator electrode switch;
  said hand-sensing electrode switch being electrically connected to said capacitive hand-sensing electrode, and said simulator electrode switch being electrically connected to said simulator electrode;
  each said hand-sensing electrode switch and said simulator electrode switch being electrically connected to said microcontroller means for sequentially turning said switches on and off to sequentially send said sensor charge signal from said charge-transfer sensor to said hand-sensing electrode and said simulator electrode, and in response for said charge-transfer sensor to sequentially receive from each said hand-sensing electrode and said reference simulator electrode respective raw electrode discharge digit signals;

upon receiving an output reference simulator signal from said reference simulator electrode that indicates a defect in said multiplexing means, or an output hand-sensing discharge signal from said hand-sensing electrode that indicates the absence of the operator's hand from the hand-gripping surface, said charge-transfer sensor being effective to send said raw output reference simulator signals or said raw output hand-sensing discharge signals to said microcontroller means for evaluating and processing, and to then for said microcontroller means to send a motor shut down signal to said motor shut-down circuit.

3. In an operator-sensing circuit having a charge-transfer sensor that sends a sensor charge signal to a capacitive hand-sensing electrode and receives a discharge signal from the electrode for disabling the motor of a unit of power equipment upon the absence of an operator's hand on a hand-gripping surface of the equipment, said operator-sensing circuit comprising:

a) capacitive means for operating within a predetermined output capacitor discharge range that includes preselected binary digit values that designate hands-off and hands-on conditions on the hand-gripping surface;

b) said capacitive means includes a hand-sensing electrode having an inner dielectric material layer contiguously disposed on a metal handle portion of the power equipment, a metal sheet foil conductor material layer contiguously wrapped around the dielectric material to form a tubular configuration having two opposed end edges, and an outer dielectric hand-grip material including said hand-gripping surface that overlaps said opposed end edges thereby producing a capacitance in a grasping operator's hand, an outer hand-grip material, and the metal sheet foil conductor material layer.

4. The operator-sensing circuit as defined in claim 3, wherein said metal foil conductor material comprises copper and the metal foil layer has a thickness of about 0.10 mm to about 0.15 mm.

5. The operator-sensing circuit as defined in claim 4, wherein said metal foil tube has a length of from about 50 mm to about 60 mm, the opposed end edges are disposed about 30 mm from the ends of the hand-grip material, and the opposed respective transverse planes are perpendicular to the longitudinal axis of the foil tube.

6. The operator-sensing circuit as defined in claim 3, wherein said inner dielectric material layer has the structural configuration of a tube that extends along the length of the metal handle portion;

said metal foil has the structural configuration of a foil tube having a longitudinal axis and extends along a delimited length of the inner dielectric material tube;

said foil tube having opposed end edges that are each disposed in respective planes that traverse the longitudinal axis of the metal foil tube; and said outer hand-grip material has a length sufficient to overlap the opposed end edges of the metal foil tube.

7. In an operator-sensing circuit having a charge-transfer sensor that sends a sensor charge signal to a capacitive sensing electrode and in response receives a discharge signal from the electrode for disabling the motor of a unit of power equipment upon the absence of an operator's hand on a hand-gripping surface of the equipment, the combination comprising:

a) multiplexing means and capacitive means including operator-hand sensing electrode means and reference simulator electrode means each for receiving said sensor charge signal from said charge-transfer sensor;

b) in response to receiving said sensor charge signal, said simulator electrode means being effective to send a reference discharge signal having a designated standard digit value for determining a defect in the operator-sensing system;

c) microcontroller means electrically coupled to said multiplexing means including a series of electrode switches for issuing said sensor charge signals and electrode output signals;

d) said microcontroller means being effective to alternately turn said series of switches on and off to sequentially send said sensor charge signal to each operator-hand sensing electrode means and reference simulator electrode means, and in response for said charge-transfer sensor to sequentially receive from each operator-hand sensing and reference simulator electrode means respective electrode discharge digit signals;

e) said microcontroller means being electrically coupled for issuing command signals to said charge-transfer sensor to send said charge signals to the multiplexing means for distribution to said operator-hand sensing and reference electrode means;

f) said charge-transfer sensor being effective to send a raw data output discharge signal corresponding to each said respective electrode discharge digit signal to said microcontroller means for processing; and g) said microcontroller means being effective to disable said motor of the unit of power equipment upon determining that the reference discharge signal does not conform to said designated standard digit value, and upon alternatively determining that the output discharge signal of the operator-hand sensing electrode means indicates the absence of the operator's hand from the hand-gripping surface.

8. The combination as defined in claim 7, wherein said microcontroller means is programmable for setting a predetermined operating output capacitor discharge range including preselected binary digit values that designate hands-off and hands-on conditions on the hand-gripping surface;

said capacitor discharge range is effective to distinguish between the presence of an operator's hand and foreign material on the gripping surface for avoiding a false hands-on signal.

9. The combination as defined in claim 8, wherein a preselected binary digit value of about 700 digits designates a hands-on condition for the operator-hand sensing electrode means affixed to a hand-gripping surface, and a preselected binary digit value of about 900 digits designates a hands-off condition for the sensing electrode means affixed to a hand-gripping surface.

10. The combination as defined in claim 8, wherein said capacitor discharge digit value of said reference simulator electrode means is about 400 digits which must be received by said charge-transfer sensor to indicate that no defect in the multiplexing means or short in the circuit of the system exists.

11. The combination as defined in claim 8, wherein
said capacitor discharge range includes a hands-off section in which foreign materials add capacitance to the hand-gripping surface that might produce a false hands-on condition, and a true hands-on section in which the operator's hand is grasping the hand-gripping surface to provide an accurate capacitor discharge digit value that allows the power equipment continued operation.

12. The combination as defined in claim 11, wherein
said capacitor discharge digit value range of said true hands-on section is about 700 to about 750 digits, and
said capacitor discharge digit value range of said false hands-on section is about 750 to about 900 digits.

13. The combination as defined in claim 7, wherein
the microcontroller means includes first microprocessor means electrically coupled to the charge-transfer sensor and second microprocessor means electrically coupled to the first microprocessor means;
said first microprocessor means electrically coupled to the multiplexing means for sequentially turning said operator-hand sensing electrode and reference simulator electrode switches on and off to send said charge signals through to the respective operator-hand sensing and reference electrode means;
said first microprocessor means being effective for commanding the charge-transfer sensor to send charge signals to the multiplexing switches to be sent through to the operator-hand sensing and references electrode means that in response send capacitive discharge signals to the charge-transfer sensor which sends to said first microprocessor means respective raw data output signals corresponding to the capacitive discharge signals received;
said second microprocessor means being effective to receive the raw data output signals from said first microprocessor means to conduct a control check on the first microprocessor means and to double check the raw data output signals;
said first and second microprocessor means being electrically coupled to respective relay switches that are, in turn, electrically coupled to an ignition system of the motor;
each said first and second microprocessor means independently processes said raw data output signals to produce output microprocessor signals to its respective relay switch that is effective to shut down the ignition system when said microprocessor output signals to their respective relay switches are not the same.

14. A method of sensing the presence of an operator's hand on a gripping surface of a power equipment unit and causing cessation of operation of a component system of the equipment if the operator's hand is removed from the gripping surface, the steps of the method comprising:
a) providing an operator-hand sensing electrode affixed to said gripping surface that includes capacitive means for operating within a predetermined output capacitor discharge range including preselected binary digit values that designate hands-off and hands-on conditions on the hand-gripping surface;
b) providing a calibrated operator-hand sensing system including a charge-transfer sensor electrically coupled to the operator-hand sensing electrode;
c) providing microcontroller means electrically coupled to the charge-transfer sensor for periodically commanding the sensor to transfer charge signals to the operator-hand sensing electrode that senses the quantity of charge on the operator-hand sensing electrode and generates a raw data output signal that is transmitted to the charge-transfer sensor which sends raw data output signals to the microcontroller means;
d) processing the raw data output signal in said microcontroller means to determine if the quantity of charge on the operator-hand sensing electrode is in said true hands-on section of the output capacitor discharge range;
e) said microcontroller means is electrically coupled to said component system of the equipment for causing cessation of operation of the component system when the raw data output signal of the charge-transfer sensor indicates that the quantity of charge is not within the true hands- on section of said capacitor discharge range.

15. The method as defined in claim 14, wherein
the component system is an internal combustion engine of the equipment and electrically couples the ignition system of the engine to ground to shut off the engine when the raw data output signal from the charge-transfer sensor to the microcontroller means indicates that the quantity of charge is not within the true hands-on section of said capacitor discharge range.

16. The method as defined in claim 14, wherein
the component system is an electric motor of the equipment and electrically interrupts a supply of power to the electric motor to shut off the electric motor when the raw data output signal from the charge-transfer sensor to the microcontroller means indicates that the quantity of charge is not within the true hands-on section of said capacitor discharge range.

17. A calibrated capacitive operator-sensing circuit in combination with a mobile power equipment unit, the combination comprising:
a) the mobile power equipment including an internal combustion engine, a magneto of the engine's ignition system, and a hand-gripping surface for an operator to grip and control movement of the mobile power equipment unit;
b) the capacitive operator-sensing circuit being adapted to sense the presence of an operator's hand on the gripping surface to shut off the engine if the operator's hand is absent from the gripping surface;
c) the capacitive operator-sensing circuit including operator-hand sensing electrode means affixed to said gripping surface that includes capacitive means for operating within a predetermined output capacitor discharge range that includes preselected binary standard digit values that designate hands-off and hands-on conditions on the hand-gripping surface;
d) said capacitor discharge range including a hands-off section and a true hands-on section which indicates that the operator's hand is grasping the hand-gripping surface;
e) said operator-hand sensing electrode means is electrically coupled to charge-transfer sensor means for sensing any quantity of charge on said electrode means;
f) microcontroller means electrically coupled to said charge-transfer sensor means for periodically commanding the sensor means to transfer charge signals to the operator-hand sensing electrode means to sense the quantity of charge on said sensing electrode means;
g) said sensor means being effective to receive raw data output discharge signals from said electrode means for sending said discharge signals to the microcontroller means for processing when the quantity of charge on the operator-hand sensing electrode means is sensed;

h) said microcontroller means being effective for processing said raw data output signals for determining if a corresponding quantity of charge on the operator-hand sensing electrode means is in said true hands-on section of the capacitor discharge range;

i) said microcontroller means being electrically coupled to said magneto of said engine's ignition system for causing cessation of the engine when the raw data output signal of the charge-transfer sensor means indicates that the sensed quantity of charge is not within the true hands-on section of said capacitor discharge range.

* * * * *